United States Patent
Anthony et al.

(10) Patent No.: US 10,770,606 B2
(45) Date of Patent: Sep. 8, 2020

(54) SOLAR ARRAY SYSTEM AND METHOD OF MANUFACTURING

(71) Applicant: Sierra Nevada Corporation, Sparks, NV (US)

(72) Inventors: Brian Anthony, Sparks, NV (US);
Rodney Dobson, Sparks, NV (US);
Matthew Johnson, Sparks, NV (US);
Scott Christiansen, Sparks, NV (US);
L. Eric Ruhl, Sparks, NV (US)

(73) Assignee: Sierra Nevada Corporation, Sparks, NV (US)

(*) Notice: Subject to any disclaimer, the term of this patent is extended or adjusted under 35 U.S.C. 154(b) by 0 days.

(21) Appl. No.: 15/819,196

(22) Filed: Nov. 21, 2017

(65) Prior Publication Data
US 2018/0097133 A1   Apr. 5, 2018

Related U.S. Application Data (63) Continuation of application No. PCT/US2016/042223, filed on Jul. 14, 2016.
(Continued)

(51) Int. Cl.
*H01L 31/041* (2014.01)
*H01L 31/048* (2014.01)
(Continued)

(52) U.S. Cl.
CPC ............ *H01L 31/041* (2014.12); *B64G 1/443* (2013.01); *H01L 21/00* (2013.01);
(Continued)

(58) Field of Classification Search
CPC . H01L 31/041; H01L 31/0443; H01L 31/048; H01L 31/0504; H01L 31/18; H01L 21/67092; H01L 21/67121; H01L 21/78
See application file for complete search history.

(56) References Cited

U.S. PATENT DOCUMENTS 4,509,248 A   4/1985   Spitzer et al.
5,021,099 A   6/1991   Kim et al.
(Continued)

FOREIGN PATENT DOCUMENTS

EP   0 926 743 A2   6/1999
JP   H8298334 A    11/1996
(Continued)

OTHER PUBLICATIONS

Kim et al., "2D-Modeling and Development of Interdigitated Back Contact Solar Cells on Low-Cost Substrates", Mar. 2006, 2006 IEEE 4th World Conference on Photovoltaic Energy Conference.*

*Primary Examiner* — Peniel M Gumedzoe
(74) *Attorney, Agent, or Firm* — Mintz Levin Cohn Ferris Glovsky and Popeo, P.C.

(57) ABSTRACT

A space-grade solar array includes relatively small cells with integrated wiring embedded into or incorporated directly onto a printed circuit board. The integrated wiring provides an interface for solar cells having back side electrical contacts. The single side contacts enable the use of pick and place (PnP) technology in manufacturing the space-grade solar array. The solar cell is easily and efficiently packaged and electrically interconnected with other solar cells on a solar panel such as by using PnP process. The back side contacts are matched from a size and positioning standpoint to corresponding contacts on the printed circuit board.

26 Claims, 9 Drawing Sheets

Related U.S. Application Data (60) Provisional application No. 62/197,470, filed on Jul. 27, 2015.

(51) Int. Cl.

| | | |
|---|---|---|
| *H01L 31/0443* | (2014.01) | |
| *H01L 31/18* | (2006.01) | |
| *H01L 31/05* | (2014.01) | |
| *H01L 31/042* | (2014.01) | |
| *H01L 21/00* | (2006.01) | |
| *H01L 31/0224* | (2006.01) | |
| *B64G 1/44* | (2006.01) | |
| *H01L 21/67* | (2006.01) | |
| *H01L 21/78* | (2006.01) | |

(52) U.S. Cl.
CPC .... *H01L 31/022441* (2013.01); *H01L 31/042* (2013.01); *H01L 31/048* (2013.01); *H01L 31/0443* (2014.12); *H01L 31/0504* (2013.01); *H01L 31/0516* (2013.01); *H01L 31/18* (2013.01); *H01L 21/67092* (2013.01); *H01L 21/67121* (2013.01); *H01L 21/78* (2013.01); *Y02E 10/50* (2013.01)

(56) References Cited

U.S. PATENT DOCUMENTS

| | | | |
|---|---|---|---|
| 5,185,042 A | 2/1993 | Ferguson | |
| 5,800,631 A | 9/1998 | Yamada et al. | |
| 6,159,757 A | 12/2000 | Kamimura et al. | |
| 6,300,158 B1 | 10/2001 | Simburger et al. | |
| 6,313,396 B1 | 11/2001 | Glenn | |
| 6,337,283 B1* | 1/2002 | Verlinden | H01L 31/1804 136/256 |
| 7,235,736 B1 | 6/2007 | Buller et al. | |
| 7,468,485 B1 | 12/2008 | Swanson | |
| 7,554,031 B2* | 6/2009 | Swanson | H01L 31/02167 136/261 |
| 7,633,006 B1 | 12/2009 | Swanson | |
| 7,820,475 B2 | 10/2010 | De Ceuster et al. | |
| 8,163,638 B2 | 4/2012 | De Ceuster et al. | |
| 8,232,129 B2 | 7/2012 | Streett | |
| 8,409,912 B2 | 4/2013 | de Ceuster et al. | |
| 8,614,395 B1 | 12/2013 | Nielson et al. | |
| 2005/0161079 A1* | 7/2005 | Gray | H04B 1/3883 136/251 |
| 2008/0223429 A1 | 9/2008 | Everett et al. | |
| 2008/0251121 A1* | 10/2008 | Stone | H01L 31/02168 136/256 |
| 2009/0266395 A1* | 10/2009 | Murthy | F24J 2/06 136/206 |
| 2011/0197951 A1* | 8/2011 | Abiko | B23P 11/022 136/246 |
| 2011/0272006 A1* | 11/2011 | Sainoo | H01L 31/048 136/251 |
| 2011/0315186 A1* | 12/2011 | Gee | H01L 31/1804 136/244 |
| 2012/0024337 A1* | 2/2012 | Bellacicco | H02S 40/36 136/244 |
| 2013/0112233 A1 | 5/2013 | Coakley | |
| 2013/0181344 A1* | 7/2013 | Yanase | H01L 21/486 257/737 |
| 2014/0167677 A1* | 6/2014 | Voelkner | H02J 7/35 320/101 |
| 2014/0196779 A1* | 7/2014 | Fidaner | H01L 31/022441 136/255 |
| 2014/0370650 A1 | 12/2014 | Moslehi et al. | |
| 2015/0284244 A1* | 10/2015 | Ho | B81B 7/007 438/48 |
| 2015/0287865 A1* | 10/2015 | Aiken | H01L 31/0508 136/251 |

FOREIGN PATENT DOCUMENTS

| | | |
|---|---|---|
| JP | H11238896 A | 8/1999 |
| JP | 2001332753 A | 11/2001 |
| JP | 2010506733 A | 3/2010 |
| TW | 201324823 A | 6/2013 |
| WO | WO-2005/091378 A2 | 9/2005 |
| WO | WO-2008/049006 A2 | 4/2008 |

* cited by examiner

PRIOR ART

SOLAR ARRAY SYSTEM AND METHOD OF MANUFACTURING

CROSS-REFERENCES TO RELATED APPLICATIONS

The present application is a continuation of International Patent Application No. PCT/US2016/042223, filed Jul. 14, 2016, which claims priority to U.S. Provisional Patent Application No. 62/197,470 filed Jul. 27, 2015; which applications are incorporated herein by reference in their entirety.

BACKGROUND

The present disclosure relates to a space-grade solar array system (also referred to simply as a "solar array") and a method of manufacturing such a system.

Current methods of manufacturing space-grade solar arrays are severely limited with respect to automation and modularization in the manufacturing process. To the extent that there are automated manufacturing systems, such systems are required to be highly customized and do not scale well to various solar array power requirements and sizes. Moreover, current systems do not address the high labor costs and monetary costs associated with connecting solar cells in series and in parallel utilizing a wire harness in the front and back side of the solar panel.

In view of the foregoing, there is a need for improved methods of manufacturing space-grade solar arrays using modern industrial grade automated machinery and methods.

SUMMARY

Disclosed herein is a space-grade solar array and an associated method of manufacturing a space-grade solar array wherein the manufacturing method is highly automated and modularized. The automated and modularized manufacturing process can eliminate or reduce the likelihood of deficiencies due to human error and quality of workmanship, which can be a leading cause of solar array failure for space grade solar arrays.

In one aspect, there is disclosed a method of manufacturing a space-grade solar array, comprising: providing a solar wafer having a plurality of solar cells; covering the solar cell wafer with a protective coverglass; cutting both the solar cell wafer and the coverglass into a plurality of solar cells, wherein each solar cell has a positive electrical contact and a negative electrical contact with both the positive electrical contact and the negative electrical contact being located on a common, back side of the solar cell; and positioning the solar cells onto a printed circuit board with the back side of each solar cell in contact with the front side of the printed circuit board such that the positive electrical contact and the negative electrical contact of each solar cell electrically couples to a corresponding electrical contact of the printed circuit board, and wherein the printed circuit board has electrical traces that include solar cell-to-solar cell interconnect wiring and bypass and blocking diodes. The protective coverglass can be positioned over the solar cell wafer prior to cutting the solar cell wafer into a plurality of solar cells. In an alternate embodiment, the protective coverglass is positioned over the plurality of solar cells after cutting the solar cell wafer into a plurality of solar cells and while the plurality of solar cells are positioned on the printed circuit board.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The figures are not necessarily to scale in absolute terms or comparatively but are intended to be illustrative. Also, relative placement of features and elements may be modified for the purpose of illustrative clarity.

DETAILED DESCRIPTION

Disclosed is a space-grade solar array and an associated method of manufacturing a space-grade solar array wherein the manufacturing method is highly automated and modularized. The automated and modularized manufacturing process can eliminate or reduce the likelihood of deficiencies due to human error and quality of workmanship, which can be a leading cause of solar array failure for space grade solar arrays.

The disclosed space-grade solar array includes relatively small cells with integrated wiring embedded into or incorporated directly onto a printed circuit board. The integrated wiring provides an interface for solar cells having back side (i.e., a single side) electrical contacts. The single side contacts enable the use of pick and place (PnP) technology in manufacturing the space-grade solar array. That is, both a positive electrical contact and a negative electrical contact reside on the same side (such as the back side) of the solar cell. Because the solar cell includes all back side electrical contacts, the solar cell is easily and efficiently packaged and electrically interconnected with other solar cells on a solar panel such as by using PnP process. The back side contacts are matched from a size and positioning standpoint to corresponding contacts on the printed circuit board.

In addition, the solar array is manufactured according to a process wherein a coverglass is integrated onto the solar cell at the wafer level, prior to dicing of the wafer to form the solar cells. During the cell manufacture process, a single sheet of coverglass is positioned over a section of the solar cell wafer or the entire solar cell wafer. The coverglass is then cut in combination with a plurality of solar cells to form a plurality of solar cells each of which is covered by a coverglass. This makes the manufacturing process more efficient.

Figure 1:
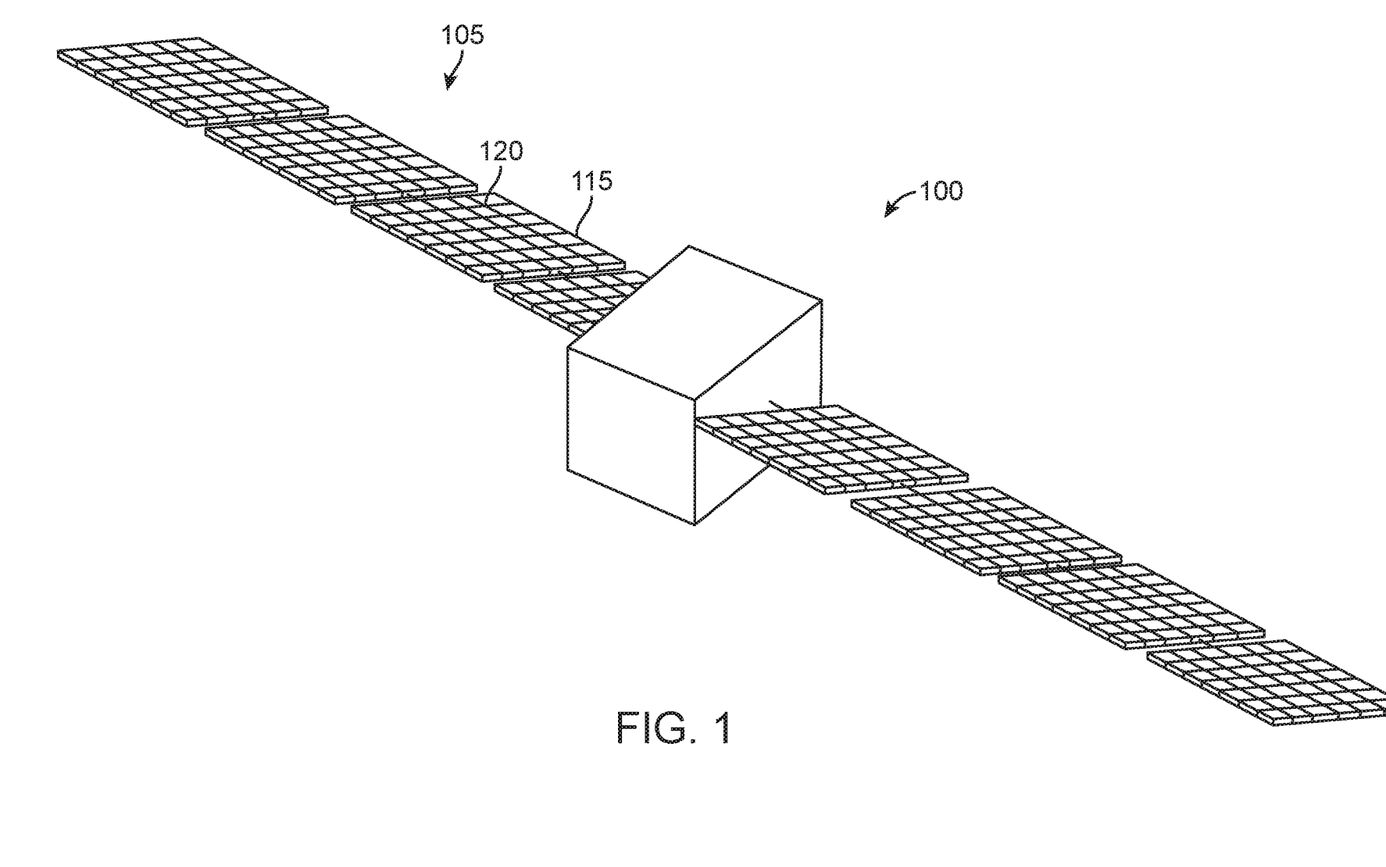
FIG. 1 shows a spacecraft having a structure that includes one or more solar panels.

FIG. 1 shows a spacecraft 100, such as a satellite, having a structure that includes one or more solar panels 105. The solar panels can incorporate a solar array system that is manufactured according to the processes described herein. The solar panels can transition between a collapsed, or stowed, state and an expanded, or deployed, state in a well-known manner. The solar arrays 115 include one or more solar panels 105 which may include any quantity of solar cells 120 that are bonded to each solar panel 105. The solar cells are mechanically mounted to the corresponding solar panel, or other substrate, and electrically connected to each other using electrically conductive interconnectors to result in a solar power supply network. The solar cells include accompanying circuitry that transform sunlight into electrical energy. In this manner, the solar cells 120 provide electrical power such as, for example, to charge batteries and/or drive one or more spacecraft systems.

Figure 2:
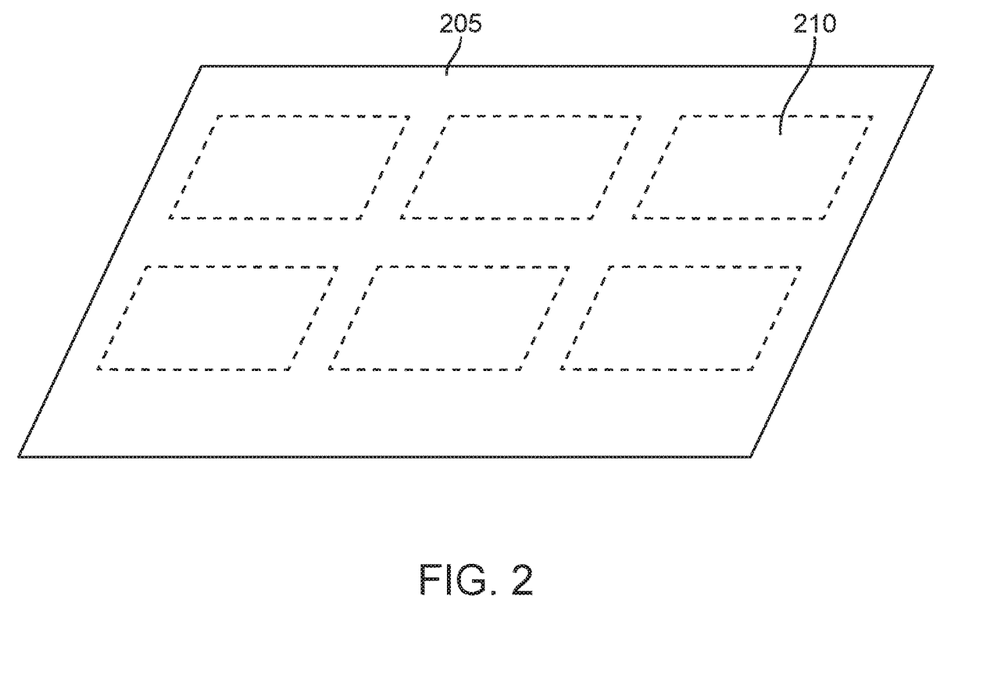
FIG. 2 shows a schematic representation of a printed circuit board (PCB) that serves as a substrate on which a plurality of solar cells is mounted.

FIG. 2 shows a schematic representation of a printed circuit board (PCB) 205 that serves as a substrate on which a plurality of solar cells 210 are mounted. The PCB is a planar structure having a front side, a backside, and a thickness. In an embodiment, the PCB has a plurality of electrical contacts on the front side with at least some of the electrical contacts being sized, shaped and positioned to match corresponding electrical contacts on a back side of at least one of the solar cells 210 to establish an electrical coupling between the solar cells 210 and the PCB when the solar cell is mounted on the PCB. The quantity of solar cells can vary and is not limited by what is shown in FIG. 2. In addition, the solar cells 210 can be arranged in various patterns that are not to be limited by what is shown in FIG. 2. A printed circuit board is also sometimes referred to as a printed wiring board.

The small size of the disclosed solar cells permits the usage of available space on the PCB to be optimized so as to maximize the quantity of solar cells that can be coupled to the PCB. In a non-limiting example, a "small size" solar cell is less than 20 cm$^2$. A "large" cell is in the range of about 60 cm$^2$ or greater in size, with solar cell sizes commonly in the range of about 26 cm$^2$ to 31 cm$^2$ in size. In an embodiment, the solar cells used in are larger than 1 cm$^2$ to less than 20 cm$^2$ in total active area.

In an embodiment, when the solar cells 210 are mounted on the PCB, the PCB 205 serves as the solar panel itself wherein the solar panel includes a support structure and electrical components (e.g., wiring cells, resistors, diodes, thermistors etc.). In another embodiment, the PCB 205 serves as a support structure or backing structure. In this embodiment the solar panel includes the PCB 205, the solar cells 210 and the separate support structure that provides structural support. The PCB can be a rigid structure or it can be a flexible structure.

Each solar cell 210 (photovoltaic cell) has a front side and a back side. Each solar cell is an electrical device that converts the energy of light directly into electricity by the photovoltaic effect. Each solar cell can have electrical characteristics, such as current, voltage, or resistance, that vary when exposed to light. In addition, each solar cell 210 has both positive electrical terminal(s) (or contacts) and negative electrical terminal(s) located on a common, back side of the solar cell with the back side being the side that is juxtaposed in contact with a front surface of the PCB 205. The solar cells 210 can be arranged in an array of coplanar parallel rows on the PCB 205. The PCB has formed thereon a plurality of conductive traces or paths that connect the solar cells to each other as well as to other electronic components of the PCB 205. In an embodiment, the PCB 205 is formed or two or more layers, each layer having at least one conductive path printed thereon.

Figure 3:
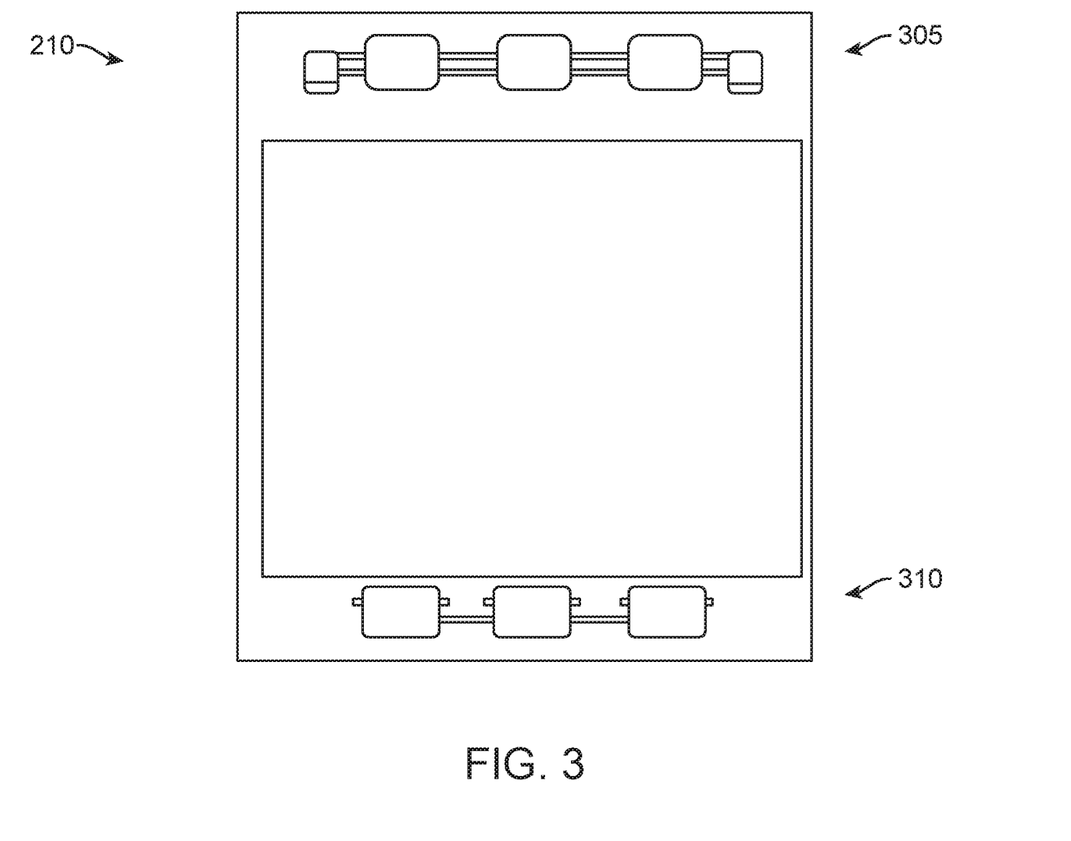
FIG. 3 shows an example form factor of electrical contacts of a solar cell.

As mentioned, the electrical contacts of the solar cell are arranged in a predetermined pattern, or form factor, that match a corresponding and complementary pattern of electrical contacts on the PCB. This enables the solar cells to be coupled to the PCB using automated devices and methods, including robotic devices and PnP technology. FIG. 3 shows a backside of a solar cell 210 with positive electrical contacts 305 and negative contacts 310 arranged in a predetermined pattern. As mentioned, the PCB has corresponding positive and negative electrical contacts arranged in a complementary pattern that match the pattern of the contacts on the solar cell 210. It should be appreciated that the pattern shown in FIG. 3 is an example as non-limiting on this disclosure.

Figure 4:
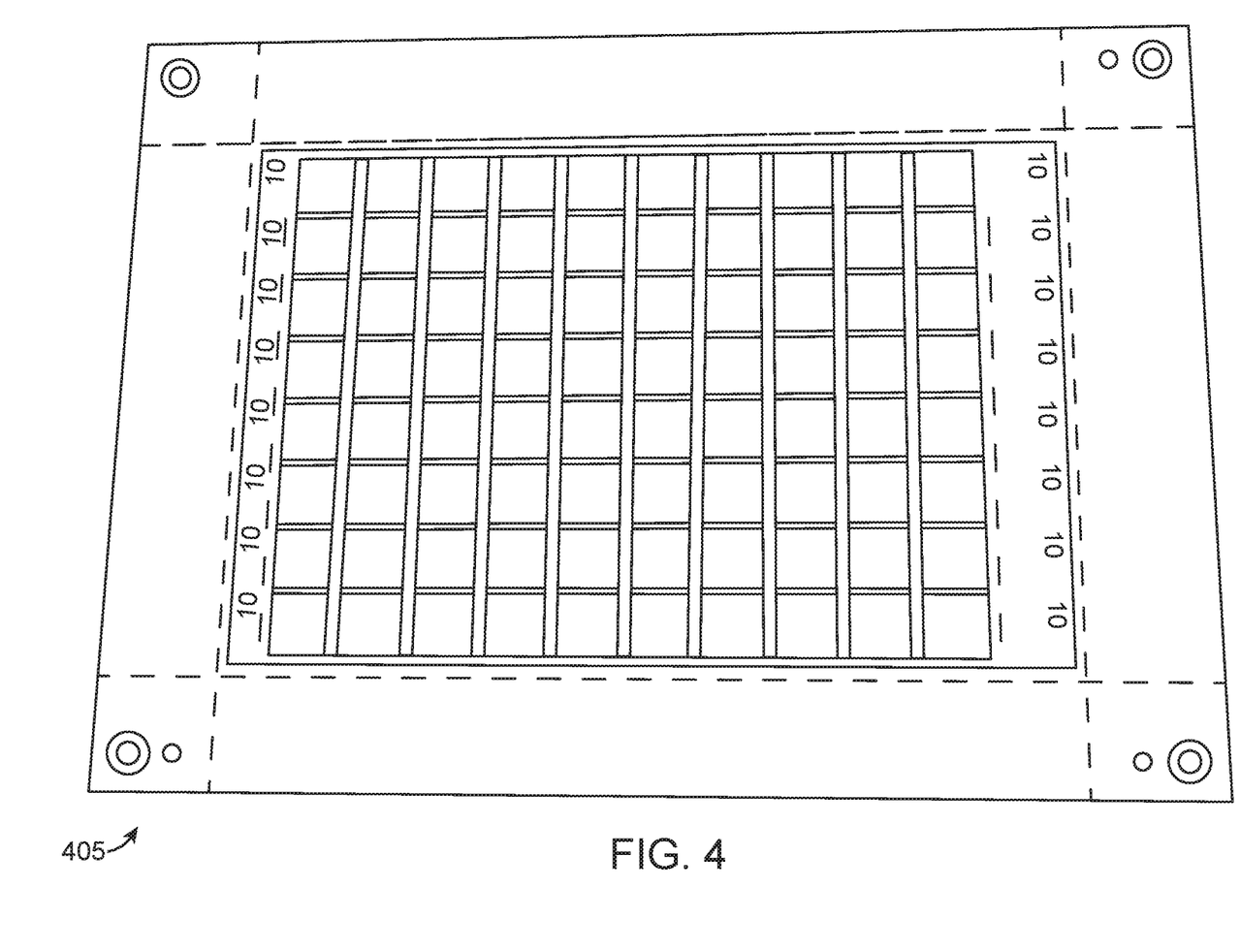
FIG. 4 shows a with a plurality of solar cells positioned on a front side of a printed circuit board.

A solar power distribution network is formed by electrically connecting all of the solar cells 205 in a given row in electrical series or parallel. The solar cells 210 are physically and electrically connected to the PCB 205, as well as electrically connected to a power supply network. FIG. 4 shows an exemplary PCB 405 with a plurality of solar cells positioned on the front side of the PCB such that the electrical contacts on the back side of each solar cell are electrically coupled in contact with a corresponding set of electrical contacts on the front side of the PCB 210. The solar cells are arranged in a grid or array pattern although it should be appreciated that the manner in which the solar cells are arranged on the PCB vary.

As mentioned, the solar cells 205 are of a type wherein both the positive and negative terminals are located on and accessible from one side, such as the back side, of the solar cell. On the back side of PCB 205, or the surface opposite the solar cells 210, one or more electrically conductive mounting pads are located to enable attachment and electrical connection of other circuit elements and/or to a support structure or backing structure of a solar panel so as to form a solar array. The positive and negative terminals of the solar cells 210 (located on a common back side of the solar cells) can be connected to corresponding electrical pads on the front surface of the PCB 205 using PnP technology.

Figure 5:
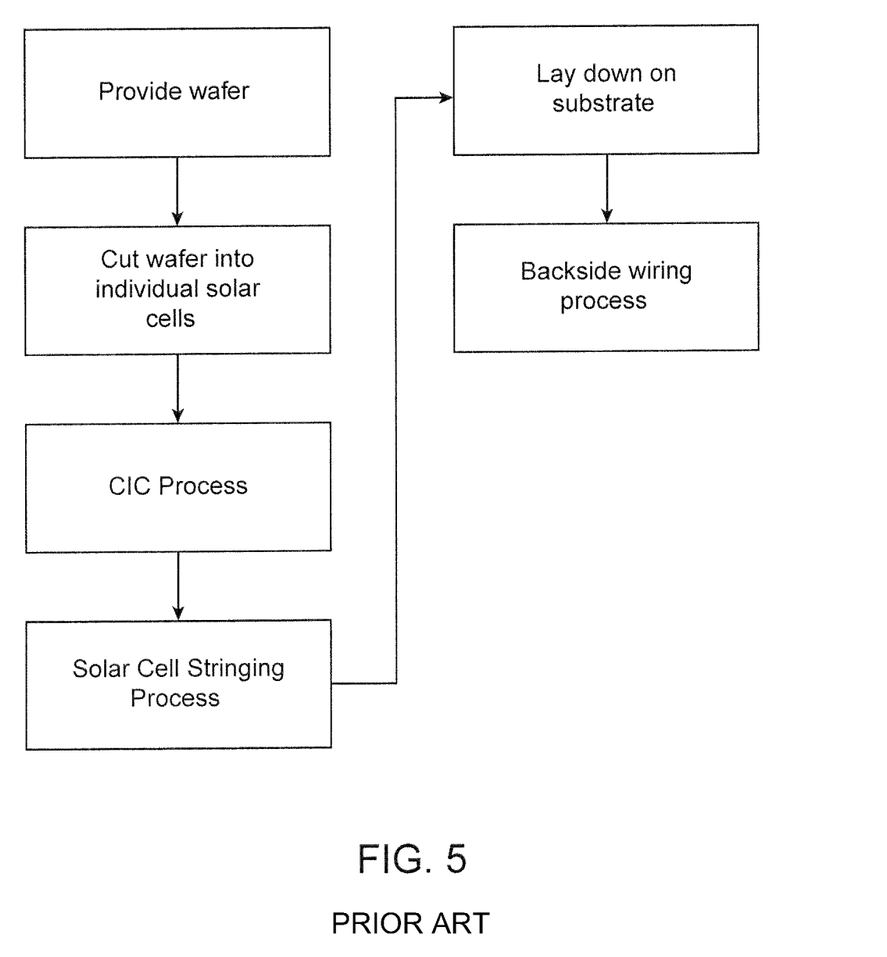
FIG. 5 shows a flow diagram of a conventional process for manufacturing a solar array using space flight applications.

FIG. 5 shows a flow diagram of a conventional method of manufacturing a solar array. The steps of the method are typically all performed manually by a human or by a human in combination with custom-made machinery and/or robots. In a first step, a solar cell wafer (such as a silicon wafer) is produced or otherwise obtained. A typical solar cell wafer has electrical contacts on both sides of the wafer with the positive contacts on a first side and the negative contacts on an opposite, second side of each solar cell of the solar cell wafer. According to a next step, the solar cell wafer is cut into individual solar cells in a well-known manner, such as by using a saw, to obtain a single large solar cell or a plurality of smaller solar cells. The solar cells are then processed according to a conventional Coverglass Interconnected Cell (CIC) process. According to this process, each solar cell is individually assembled with appropriate electronic components with the components being positioned on both the front side and back side of each solar cell due to positive and negative terminals being located on opposite sides of the solar cell. After the electronic components are properly coupled to the solar cells, each solar cell is manually and individually covered with a coverglass material that protects the electronic components.

The solar cells are then soldered or resistance welded into cell chains, known as strings, pursuant to a wiring process. Custom-made machinery and/or robots are used to place the cells into series wired string arrangements. The strings are then manually laid or placed by a human onto prepared composite substrates to create a solar panel. The assembled strings are then connected in series and in parallel utilizing a wire harness on the front and back side of the solar panel. The aforementioned method is very tedious and time-consuming as many of the steps must be performed manually by a human or by custom-made machinery.

Figure 6:
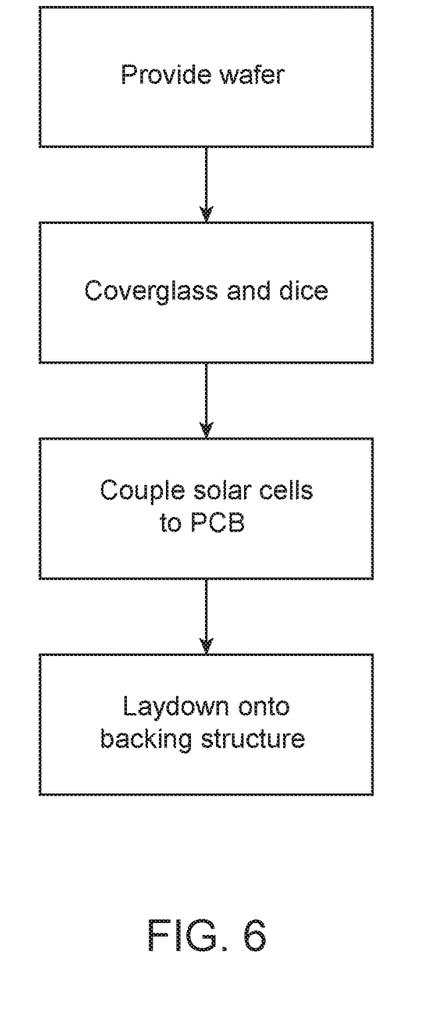
FIG. 6 shows a flow diagram of an improved process for manufacturing a solar array incorporating automated pick and place industrial machinery and processes.

FIG. 6 shows a flow diagram of an improved method of manufacturing a solar array according to the present disclosure. Note that the disclosed method eliminates the CIC step and the stringing step, which reduces the time and labor associated with the entire process. As described in detail below, the method also eliminates the back side wiring steps, which further reduces the time and labor associated with the entire process. In addition, automated PnP technology is used to eliminate a manual step associated with the conventional process.

Figure 7:
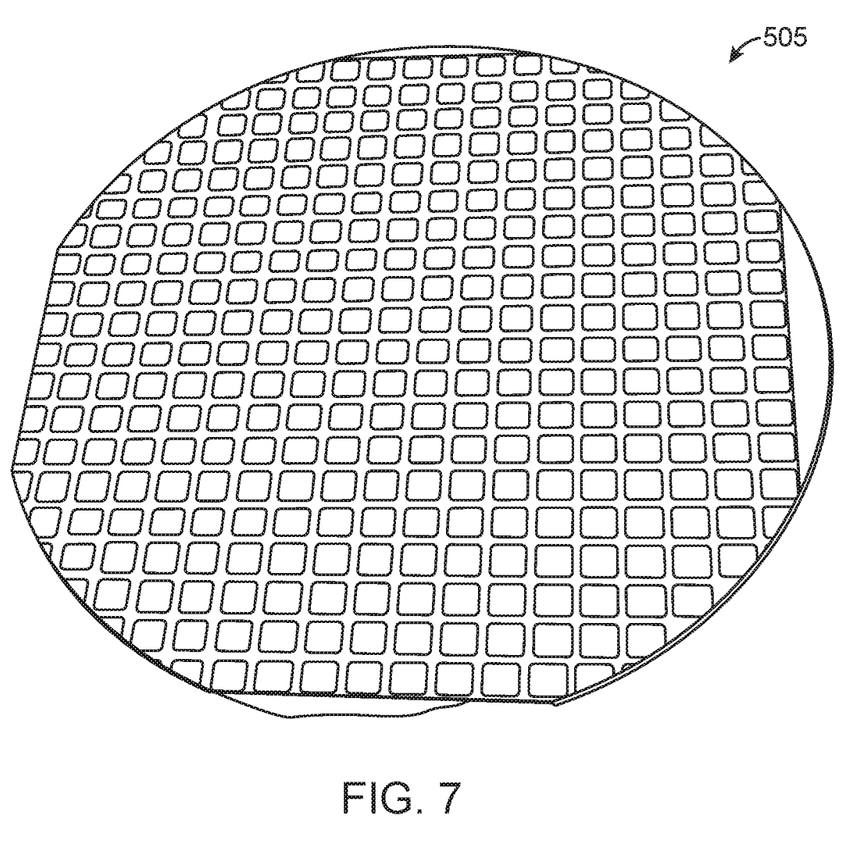
FIG. 7 shows an example of a solar cell wafer.

With reference to FIG. 6, in a first step, a solar cell wafer is provided or manufactured. FIG. 7 shows an example of a solar cell wafer 505, which includes a plurality of solar cells arranged in a grid pattern. As mentioned, each of the solar cells of the wafer 505 is configured such that the positive electrical contacts and the negative electrical contacts are located on a common, back side of the solar cell. The solar cells can incorporate the positive and negative terminals on the back side of the solar cell using a through wafer via technology that has been developed and proven on many terrestrial space related applications. The contacts can also be located on the back side and still be compatible. This enables a surface mount technology (SMT) approach for state of the art, high efficiency solar cells and allows the assembly of the array to be completed through standard and well understood PnP technology.

A coverglass is then positioned over the entire wafer and thus over a plurality of solar cells prior to the dicing process. In an embodiment, a single coverglass is sized so that it can be placed over a plurality of solar cells. The single coverglass can be at least as large in area as the solar cell wafer such that the single coverglass is sufficiently large to cover every solar cell on the wafer. In another embodiment, the coverglass is smaller than the wafer such that a single coverglass covers a plurality of solar cells but not all the solar cells on the wafer. In such an embodiment, a plurality of coverglass elements can be used to collectively cover all or some of the solar cells of the wafer.

The wafer is then diced, or cut, into individual solar cells along with the coverglass such that both the solar cells and the coverglass are collectively cut during the dicing process. That is, a cutting tool is activated so that it cuts through the coverglass and also through a solar cell directly beneath the coverglass, such as in a single stroke of the cutting tool. This results in a plurality of solar cells with each solar cell having a dedicated coverglass that covers that solar cell. Because the connection wiring of the solar cells is integrated onto the PCB upon which the solar cells will be positioned, there is no need to separately position electronic components on the front side of the solar cell. This enables a single coverglass cover over a plurality of solar cells at the wafer level. The radiation protective coverglass provides increased rigidity of the individual solar cell as well as optimized manufacturing at the assembly level.

In a next step, the solar cells (with coverglass already positioned on the solar cells) are placed onto and structurally and electrically coupled to the PCB with the electrical contacts being matched with respect to thermal expansion between the PCB and the solar cells. That is, each electrical contacts of the solar cell may have a coefficient of thermal expansion (CTE) that matches a CTE of the corresponding electrical contact of the PCB. As mentioned, each solar cell has positive and negative electrical contacts on the back side of the solar cell such that the electrical contacts contact and couple with corresponding contacts on the front side of the PCB. The PCB contains the entire cell interconnects and back side wiring integrated into one easily manufactured and automated assembly. This approach eliminates the need for costly touch labor to electrically and physically connect the solar cells. The electrical traces of the PCB include all of the cell-to-cell interconnect wiring, as well as the bypass or blocking diodes, strings and parallel circuit configurations. In an embodiment, a two-sided PCB is used to incorporate the solar cells on one side and the bypass and blocking diodes on an opposite side of the PCB.

Figure 8:
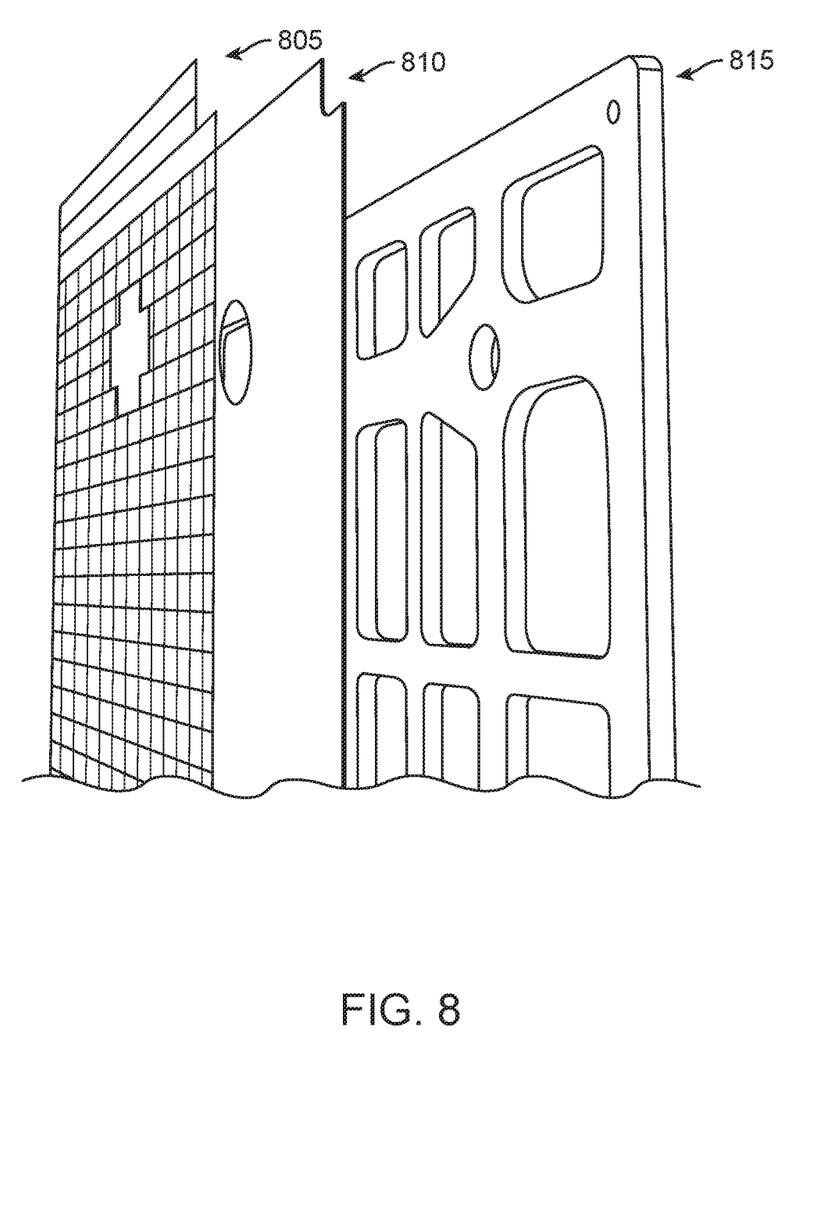
FIG. 8 shows solar cells with integrated coverglass positioned adjacent a PCB to which the PCB will be mounted.
Figure 9:
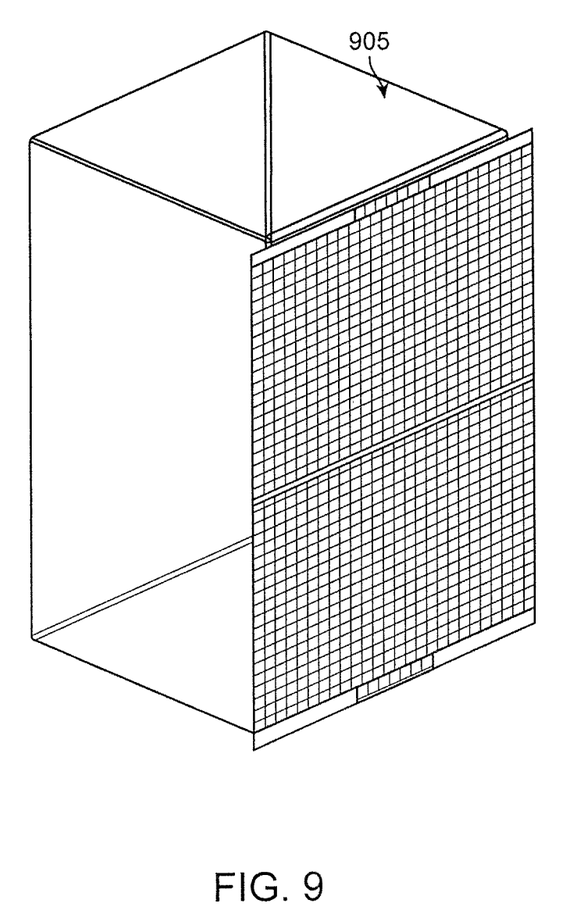
FIG. 9 shows a PCB with attached solar cells having integrated coverglass mounted directly onto a surface of a spacecraft structure.

This enables the solar cells to be laid onto a printed circuit board that form the substrate with the electrical wiring incorporated into the PCB. It also eliminates the back side wiring step that is associated with the conventional manufacturing process. The PCB with the attached solar cells having integrated coverglass can then be mounted to a backing structure. FIG. 8 shows the solar cells 805 with integrated coverglass positioned adjacent a PCB 810 to which it will be mounted. The PCB is then mounted on a backing structure 815. As mentioned, the back of the PCB may have PnP blocking diodes and one or more wire harness connectors. In another embodiment, shown in FIG. 9, the PCB with the attached solar cells having integrated coverglass is simply mounted onto a surface of a schematic representation of a spacecraft structure 905. The PCB 805 may also be integrated into a spacecraft deployable multi-panel solar array.

Thus, integrating the coverglass at the wafer level while leaving the positive and negative contacts accessible on the back side eliminates the CIC process that is required in the conventional approach. Integrated coverglass also facilitates repair and rework because every cell has an independent and dedicated coverglass and each cell can be removed or replaced with relative ease. The disclosed method can also include a step of removing and replacing a single solar cell of the solar cell array from the PCB without having to remove all of the solar cells.

In an alternate embodiment a single or plurality of large sheets of coverglass or other protective coating is positioned over a large section of the PCB after a solar cell has been positioned on the PCB such that the coverglass covers a plurality of solar cells on the PCB. Possible coverglass materials include resins or polymers that are sprayed or laminated on the cells at the assembly level.

The improved space-grade solar array manufacturing process also utilizes very small cells in contrast with the conventional approach of using very large area cells for manufacturing space rated solar arrays. There are several advantages to utilizing small solar cells including, for example, allowing the use of PnP and SMT during the manufacturing process. Another advantage is that the use of small cells minimizes concerns with respect to coefficient of thermal expansion (CTE) stresses between the solar cells and PCBs as well as minimizing thermal conduction concerns.

The use of small cells also permits higher tolerance to micrometeorite impacts and shadowing that may occur when the solar arrays are used in outer space, as the loss of a single, small cell is typically a very small percentage of the entire array power. That is, a large quantity of individual, "small" cells collectively form the entire array power, with each individual cell forming only a small percentage (such as less than 5%) of the entire power capability. So a loss of a single cell will not adversely affect the power capability of the entire array. The use of small cells can maximize the packing factor resulting in increased watts per area and also enables a high-voltage bus in a very small area. The automated process improves reliability and eliminates or significantly reduces human error. The disclosed process also eliminates the need for additional thermal adhesive between the cells and substrates although this is not limiting on this disclosure.

A reduction in non-recurring engineering (NRE) cost is achieved by creating voltage/power modules with the PCBs described above. A power module can be achieved by populating a predetermined sized and shaped PCB with solar cells. Multiple power modules can be arranged to populate large areas of various shapes and stay-in zones to produce a space-grade array for any power class. The size of the power module depends on the application and the large area PCB that can be manufactured by the majority of suppliers in the electronics manufacturing field.

Furthermore, the solar array includes bypass and blocking diodes which are all placed on the back side of the PCB. This approach for the bypass and blocking diodes maximizes the active area on the front of the panel while still incorporating the necessary cell and string protection that is found in conventional arrays. Diodes on the back side of the panel dramatically increases the packing factor on the front side of the panel and results in a more efficient array from a power density (e.g., watt/m$^2$) perspective.

The configuration of the back side contact of the positive and negative terminals of the solar cell is also improved. The configuration of the mounting pads is optimized to maximize thermal conduction while minimizing coefficient of thermal expansion (CTE) stresses. The final configuration was developed through multiple iterations of thermal and thermal-mechanical analysis and material selection.

The material and construction for the PCB can result in a highly stiff PCB, if needed in certain configurations, with the corresponding solar cell, coverglass, and PCB matched to one another from the standpoint of CTE.

Several aspects of the disclosed process solve several current challenges in the production of space-grade solar arrays. The conventional approach is dominated by touch labor costs and manufacturing defects induced by human error. The disclosed process virtually eliminates touch labor and human error to reduce cost and produce a much more reliable and higher yield end product.

Various aspects of the space-grade solar array system and manufacturing process are now described using some non-limiting examples below. It should be appreciated that the disclosed devices and processes are not specific to a subset of cells and are applicable to any cell type with a compatible form factor.

Solar Cell Configuration

As mentioned, the system utilizes small (such as, for example less than 15-20 cm$^2$) single and multi-junction solar cells, wherein the positive and negative terminals are provided or otherwise located on the back side of the solar cell. Examples include silicon mono and polycrystalline cells, quantum cells, CdTe cells, CIGS cells and III-V cells.

As mentioned, the coverglass is integrated at the wafer level prior to dicing/cutting. This step involves a particular bonding operation and material selection. The cells are then delivered on an industry standard PnP compatible fixture (e.g., flex tape, reels, etc.). The cell footprint is standardized such that a multitude of cell types can be interchanged without modification to the configuration. That is, the cells on the PCB can be grouped into cells of common size and shape. Other types of cells include single junction III-V cells, multi-junction III-V cells, and single junction CdTe cells, as non-limiting examples.

Panel Configuration

In a non-limiting example, the panel utilizes a modified PCB configuration that incorporates carbon fiber reinforcements within the layers of the PCB to minimize CTE effects and maximize panel stiffness.

As mentioned, all the wirings for the cell interconnects, bypass and blocking diodes, strings, and parallel circuit configurations are incorporated within the electrical traces of the PCB. A two-sided PCB is utilized to incorporate the solar cells on one side and the bypass and blocking diodes on the other side. In addition, a design modularity concept is incorporated into the manufacturing process to reduce design efforts and minimize cost. Standardized voltage modules for various bus voltages include a large range from 6V to 300V.

In addition, the modular concept is also utilized in the solar cell such that any size cell, from 0.5 cm$^2$ to 20 cm$^2$, for example, can be utilized with minimal change to the board design concept. The PCB's may be designed to utilize standard industry best practices for PCB manufacturing and inspection and can be rapidly reconfigured to optimize a current application.

Cell Interconnects

The cell laydown process is configured to be compatible with standard electronics industry PnP equipment. Solder paste and/or preforms are utilized to complete the electrical connection between the solar cell and the PCB. The formulations of the interconnect substance include, for example, Sn96, Sn63, and AuSn in paste form and in preforms.

Panel Assembly

The assembly process utilizes standard electronics manufacturing and inspection processes. The packing factor of the cells on the PCB has been optimized by reducing the space between cells in both the X and Y direction with respect to conventional practice of 0.030 inch spacing to as little as 0.003 inch.

Modular Configuration

Individual power modules are generated by utilizing industry best practices for the size of the PCB and largest allowable assembly processes. The design of the voltage modules within the power module can be based on a standard configuration to minimize NRE and design costs. The power modules are arranged into larger panel assemblies as the array power increases. These power modules are connected together to form an entire power array with connectors/connections that are integrated into each power module.

Support Structure

The power modules, which are formed by a plurality of solar cells coupled to a PCB, are arranged on a rigid backing structure to form larger arrays. The backing structure provides support for the power modules, allocations for hold down mechanisms, and features for hinge attachments. In another embodiment, a flexible structure or panel can be used to attach a plurality of rigid support structures to one another. This permits one rigid structure to move or articular relative to another rigid structure with the flexible structure providing a range of movement.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flow(s) when depicted in the accompanying figures and/or described herein do not necessarily require the particular order shown, or sequential order, to achieve desirable results. Other implementations may be within the scope of the following claims.

The invention claimed is:

1. A method of manufacturing a space-grade solar array, comprising:
dicing a multi-junction solar wafer having a plurality of solar cells to form a plurality of diced multi-junction solar cells, wherein each solar cell already has a positive electrical contact and a negative electrical contact both located on a common, back side of the solar cell;
using a pick and place robot to position the diced solar cells onto a printed circuit board with the back side of each diced solar cell in contact with a front side of the printed circuit board such that the positive electrical contact and the negative electrical contact of each diced solar cell electrically couples to a corresponding electrical contact of the printed circuit board, and wherein the printed circuit board has electrical traces that include solar cell-to-solar cell interconnect wiring and bypass and blocking diodes, and wherein the positive electrical contact and the negative electrical contact of each diced solar cell has a coefficient of thermal expansion that matches a coefficient of thermal expansion of the electrical contact of the printed circuit board; and
after the plurality of diced solar cells are positioned on the printed circuit board, covering the plurality of diced solar cells with a coverglass material while the diced solar cells are positioned on the printed circuit board and bonding the coverglass material to the plurality of diced solar cells.

2. The method of claim 1, wherein the printed circuit board is rigid.

3. The method of claim 1, wherein the printed circuit board is flexible.

4. The method of claim 1, wherein the printed circuit board serves as a solar array panel.

5. The method of claim 1, further comprising positioning the printed circuit board with the solar cells onto a solar array panel.

6. The method of claim 1, wherein the solar cell wafer is cut into solar cells that are no larger than 20 cm$^2$.

7. The method of claim 1, further comprising locating the bypass and blocking diodes onto a back side of the printed circuit board.

8. The method of claim 1, further comprising using a pick and place robot to position the solar cells onto the printed circuit board.

9. The method of claim 1, wherein a pick and place robot is used automatically to position the solar cells onto the printed circuit board without human intervention.

10. The method of claim 1, wherein both the positive electrical contact and the negative electrical contact are exposed contacts.

11. The method of claim 1, wherein the positive electrical contact and the negative electrical contact of each diced solar cell has a size that matches a size of respective electrical contact of the printed circuit board.

12. The method of claim 1, wherein only the diced solar cells are positioned on the printed circuit board.

13. The method of claim 12, further comprising removing and replacing a single solar cell from the printed circuit board.

14. The method of claim 12, further comprising removing and replacing a single solar cell from the printed circuit board without affecting a power capability of the entire solar array.

15. The method of claim 12, further comprising placing only bypass and blocking diodes on a back side of the printed circuit board.

16. The method of claim 1, further comprising removing and replacing a single solar cell from the printed circuit board.

17. A method of manufacturing a space-grade solar array, comprising:
dicing a multi junction solar wafer having a plurality of solar cells to form a diced multi-junction solar cell, wherein the diced solar cell already has a positive electrical contact and a negative electrical contact both located on a common, back side of the diced solar cell;
covering the diced solar cell with a protective coverglass, wherein the coverglass is a space-grade, radiation protective coverglass;
using a pick and place robot to position the diced solar cells onto a printed circuit board with the back side of the diced solar cell in contact with a front side of the printed circuit board such that the positive electrical contact and the negative electrical contact of the diced solar cell electrically couples to a corresponding electrical contact of the printed circuit board, and wherein the printed circuit board has electrical traces that include solar cell-to-solar cell interconnect wiring and bypass and blocking diodes, and wherein the positive electrical contact and the negative electrical contact of the diced solar cell has a coefficient of thermal expansion that matches a coefficient of thermal expansion of the electrical contact of the printed circuit board, wherein only the diced solar cells are positioned on the printed circuit board.

18. The method of claim 17, wherein the printed circuit board is rigid.

19. The method of claim 17, wherein the printed circuit board is flexible.

20. The method of claim 17, wherein the printed circuit board serves as a solar array panel.

21. The method of claim 17, further comprising positioning the printed circuit board with the solar cells onto a solar array panel.

22. The method of claim 17, wherein the solar cell wafer is cut into solar cells that are no larger than 20 cm$^2$.

23. The method of claim 17, further comprising locating the bypass and blocking diodes onto a back side of the printed circuit board.

24. The method of claim 17, further comprising using a pick and place robot to position the solar cells onto the printed circuit board.

25. The method of claim 17, wherein a pick and place robot is used automatically to position the solar cells onto the printed circuit board without human intervention.

26. The method of claim 17, wherein both the positive electrical contact and the negative electrical contact are exposed contacts.

* * * * *

UNITED STATES PATENT AND TRADEMARK OFFICE
CERTIFICATE OF CORRECTION

PATENT NO. : 10,770,606 B2  
APPLICATION NO. : 15/819196  
DATED : September 8, 2020  
INVENTOR(S) : Brian Anthony et al.

Page 1 of 2

It is certified that error appears in the above-identified patent and that said Letters Patent is hereby corrected as shown below:

In the Specification

• Column 1, Line 43, please delete "space grade" and insert --space-grade--
• Column 2, Line 21, please delete "a with" and insert --a PCB with--
• Column 2, Line 30, please delete "PCB" and insert --backing structure--
• Column 3, Line 23, please delete "PCB" and insert --PCB 205--
• Column 3, Line 25, please delete "PCB" and insert --PCB 205--
• Column 3, Line 30, please delete "PCB" and insert --PCB 205--
• Column 3, Line 31, please delete "PCB" and insert --PCB 205--
• Column 3, Line 38, please delete "PCB" and insert --PCB 205--
• Column 3, Line 40, please delete "PCB" and insert --PCB 205--
• Column 3, Line 44, please delete "used in are" and insert --used are--
• Column 3, Line 47, please delete "PCB" and insert --PCB 205--
• Column 3, Line 54, please delete "PCB" and insert --PCB 205--
• Column 3, Line 57, please delete "solar cell" and insert --solar cell 210--
• Column 3, Line 59, please delete "solar cell" and insert --solar cell 210--
• Column 3, Line 64, please delete "solar cell" and insert --solar cell 210--
• Column 3, Line 67, please delete "PCB" and insert --PCB 205--
• Column 4, Line 2, please delete "cells" and insert --cells 210--
• Column 4, Line 6, please delete "solar cell" and insert --solar cell 210--
• Column 4, Line 9, please delete "PCB" and insert --PCB 205--
• Column 4, Line 9, please delete "solar cells" and insert --solar cells 210--
• Column 4, Line 10, please delete "PCB" and insert --PCB 205--
• Column 4, Line 14, please delete "PCB" and insert --PCB 205--
• Column 4, Line 20, please delete "205" and insert --210--
• Column 4, Line 25, please delete "PCB" and insert --PCB 205--
• Column 4, Line 26, please delete "solar cell" and insert --solar cell 210--
• Column 4, Line 28, please delete "210" and insert --205--
• Column 4, Line 29, please delete "solar cells" and insert --solar cells 210--
• Column 4, Line 31, please delete "PCB" and insert --PCB 205--

Signed and Sealed this  
Fifteenth Day of December, 2020

Andrei Iancu  
*Director of the United States Patent and Trademark Office*

CERTIFICATE OF CORRECTION (continued)
U.S. Pat. No. 10,770,606 B2

- Column 4, Line 32, please delete "205" and insert --210--
- Column 4, Line 35, please delete "cell" and insert --cell 210--
- Column 5, Line 38, please delete "wafer" and insert --wafer 505--
- Column 5, Line 42, please delete "wafer" and insert --wafer 505--
- Column 5, Line 44, please delete "wafer" and insert --wafer 505--
- Column 5, Line 45, please delete "wafer" and insert --wafer 505--
- Column 5, Line 47, please delete "wafer" and insert --wafer 505--
- Column 5, Line 49, please delete "wafer" and insert --wafer 505--
- Column 5, Line 50, please delete "wafer" and insert --wafer 505--
- Column 5, Line 62, please delete "wafer" and insert --wafer 505--
- Column 6, Line 4, please delete "contacts" and insert --contact--
- Column 6, Line 21, please delete "form" and insert --forms--
- Column 6, Line 28, please delete "PCB" and insert --PCB 810--
- Column 6, Line 29, please delete "PCB" and insert --PCB 810--
- Column 6, Line 32, please delete "PCB" and insert --PCB 810--
- Column 6, Line 34, please delete "805" and insert --810--
- Column 8, Line 65, please delete "articular" and insert --articulates--

In the Claims

- Claim 11, Column 10, Line 6, please delete "of respective" and insert --of a respective--